(12) United States Patent
Kato

(10) Patent No.: US 11,893,932 B2
(45) Date of Patent: Feb. 6, 2024

(54) DISPLAY APPARATUS AND CURRENT LIMITING METHOD

(71) Applicant: JOLED INC., Tokyo (JP)

(72) Inventor: Toshiyuki Kato, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 17/999,151

(22) PCT Filed: May 17, 2021

(86) PCT No.: PCT/JP2021/018689
§ 371 (c)(1),
(2) Date: Nov. 17, 2022

(87) PCT Pub. No.: WO2021/235415
PCT Pub. Date: Nov. 25, 2021

(65) Prior Publication Data
US 2023/0222971 A1 Jul. 13, 2023

(30) Foreign Application Priority Data
May 22, 2020 (JP) .................................. 2020-089704

(51) Int. Cl.
*G09G 3/3225* (2016.01)

(52) U.S. Cl.
CPC ... *G09G 3/3225* (2013.01); *G09G 2310/0286* (2013.01); *G09G 2330/021* (2013.01)

(58) Field of Classification Search
CPC ......... G09G 3/3225; G09G 2310/0286; G09G 2330/021; G09G 2320/064;
(Continued)

(56) References Cited

U.S. PATENT DOCUMENTS 8,829,820 B2 * 9/2014 Roberts ................ G09G 3/3406
315/185 S
11,107,403 B2 * 8/2021 Kato .................... G09G 3/3233
(Continued)

FOREIGN PATENT DOCUMENTS

| JP | 2007212644 A | 8/2007 |
|----|--------------|--------|
| JP | 2009075240 A | 4/2009 |
| JP | 2015087709 A | 5/2015 |

OTHER PUBLICATIONS

International Search Report (ISR) dated Aug. 3, 2021 in International (PCT) Application No. PCT/JP2021/018689.

*Primary Examiner* — Dmitriy Bolotin
(74) *Attorney, Agent, or Firm* — CHIP LAW GROUP

(57) ABSTRACT

A display apparatus includes a display panel including a plurality of pixels, and a current limiting circuit that limits current consumption in the plurality of pixels, the current limiting circuit includes a gain computation circuit that computes a screen power value in reference to a pixel value included in a video signal and that determines a gain in reference to the screen power value, and a gain multiplication circuit that multiplies the pixel value by the gain and that outputs a limit signal including the pixel value multiplied by the gain, the display panel includes a display unit, and a lighting control circuit that controls a lighting state of the plurality of pixels in reference to a predicted power value computed according to the limit signal, to reduce a power consumption value in the plurality of pixels to a value equal to or smaller than a control target power value, the gain is 1 when the screen power value is equal to or smaller than the control target power value, and the gain is a value equal to or smaller than a value obtained by dividing the control target power value by the screen power value, in other cases.

5 Claims, 11 Drawing Sheets

(58) Field of Classification Search
CPC .... G09G 2360/16; G09G 3/3233; G09F 9/30; H10K 50/00; H10K 59/00
See application file for complete search history.

(56) References Cited

U.S. PATENT DOCUMENTS

| | | | | |
|---|---|---|---|---|
| 2009/0040674 | A1* | 2/2009 | Roberts | H05B 45/56 361/78 |
| 2010/0085285 | A1* | 4/2010 | Ozawa | H04N 5/142 345/77 |
| 2016/0005381 | A1* | 1/2016 | Yata | G09G 3/2074 345/82 |
| 2016/0155382 | A1* | 6/2016 | Cheon | G09G 3/3258 345/76 |
| 2016/0307490 | A1* | 10/2016 | Lee | G09G 3/3225 |
| 2019/0066593 | A1* | 2/2019 | Ishii | G09G 3/3233 |
| 2020/0279528 | A1* | 9/2020 | Kato | H04N 25/705 |
| 2021/0090499 | A1* | 3/2021 | Kato | G09G 3/3233 |
| 2023/0169920 | A1* | 6/2023 | Kato | G09G 3/3233 345/204 |
| 2023/0222971 | A1* | 7/2023 | Kato | G09G 3/3225 345/204 |
| 2023/0237962 | A1* | 7/2023 | Fujiwara | G09G 3/3208 345/212 |

* cited by examiner

DISPLAY APPARATUS AND CURRENT LIMITING METHOD

CROSS REFERENCE TO RELATED APPLICATIONS

This application is a U.S. National Phase of International Patent Application No. PCT/JP2021/018689 filed on May 17, 2021, which claims priority benefit of Japanese Patent Application No. JP 2020-089704 filed in the Japan Patent Office on May 22, 2020. Each of the above-referenced applications is hereby incorporated herein by reference in its entirety.

TECHNICAL FIELD

The present disclosure relates to a display apparatus and a current limiting method.

BACKGROUND ART

A display apparatus, such as an organic EL (Electro-Luminescence) display apparatus, in which each pixel includes a self-luminous element has hitherto been developed. In such a display apparatus, an increase in the size of a display panel is demanded. The power consumed in the display apparatus increases with an increase in the size of the display panel. Accordingly, a technique of suppressing the power consumption in the display apparatus is known (see PTL 1). In the display apparatus disclosed in PTL 1, the power consumption in the display panel is calculated in each horizontal period (that is, horizontal synchronization cycle) in reference to a video signal, and the current supplied to each pixel of the display panel is limited according to the calculation result, to control the power consumption of the display panel. In this way, the power consumption in the display panel is suppressed to a value equal to or smaller than a control target power value in the display apparatus disclosed in PTL 1.

CITATION LIST

Patent Literature

[PTL 1]
Japanese Patent Laid-Open No. 2007-212644

SUMMARY

Technical Problem

In the display apparatus disclosed in PTL 1, the higher the signal level corresponding to the luminance indicated in the video signal is, the faster the rise in the light emission waveform immediately after the writing of the video signal to the display panel (that is, the sharper the slope of the light emission waveform) tends to be. On the other hand, the rise in the light emission waveform after the end of a non-lighting period provided to suppress power consumption does not depend on the signal level, and the rise is constant. Hence, the gamma characteristics of the display panel (that is, the characteristics of the luminance of the display panel with respect to the signal level) vary according to the length of the non-lighting period. This reduces the image quality of the display panel.

The present disclosure has been made to solve the problem, and an object of the present disclosure is to provide a display apparatus and a current limiting method that can suppress power consumption in a display panel while suppressing reduction in image quality of the display panel.

Solution to Problem

To attain the object, a mode of the present disclosure provides a display apparatus including a display panel that includes a plurality of pixels arranged in a matrix, each of the plurality of pixels including a self-luminous element, and that displays a video according to a video signal, and a current limiting circuit that limits current consumption in the plurality of pixels, in which the current limiting circuit includes a gain computation circuit that computes a screen power value corresponding to power consumption in the plurality of pixels in reference to a pixel value included in the video signal and that determines a gain in reference to the screen power value, and a gain multiplication circuit that multiplies the pixel value by the gain and that outputs a limit signal including the pixel value multiplied by the gain, the display panel includes a display unit including the plurality of pixels, and a lighting control circuit that controls a lighting state of the plurality of pixels in reference to a predicted power value corresponding to power predicted to be consumed in the plurality of pixels, the predicted power value being computed according to the limit signal, to reduce a power consumption value in the plurality of pixels to a value equal to or smaller than a control target power value, the gain is 1 when the screen power value is equal to or smaller than the control target power value, and the gain is a value equal to or smaller than a value obtained by dividing the control target power value by the screen power value, when the screen power value exceeds the control target power value.

In addition, to attain the object, a mode of the present disclosure provides a current limiting method of limiting current consumption in a plurality of pixels included in a display panel that displays a video according to a video signal, each of the plurality of pixels including a self-luminous element, the plurality of pixels being arranged in a matrix, the current limiting method including a gain computation step of calculating a screen power value corresponding to power consumption in the plurality of pixels, in reference to a pixel value included in the video signal corresponding to each of the plurality of pixels, and determining a gain in reference to the screen power value, a gain multiplication step of multiplying the pixel value by the gain and outputting a limit signal including the pixel value multiplied by the gain, and a lighting control step of controlling a lighting state of the plurality of pixels in reference to a predicted power value corresponding to power predicted to be consumed in the plurality of pixels, the predicted power value being computed according to the limit signal, to reduce a power consumption value in the plurality of pixels to a value equal to or smaller than a control target power value, in which the gain is 1 when the screen power value is equal to or smaller than the control target power value, and the gain is a value equal to or smaller than a value obtained by dividing the control target power value by the screen power value, when the screen power value exceeds the control target power value.

Advantageous Effect of Invention

The present disclosure can provide a display apparatus and a current limiting method that can suppress power consumption in a display panel while suppressing reduction in image quality of the display panel.

DESCRIPTION OF EMBODIMENT

Figure 1:
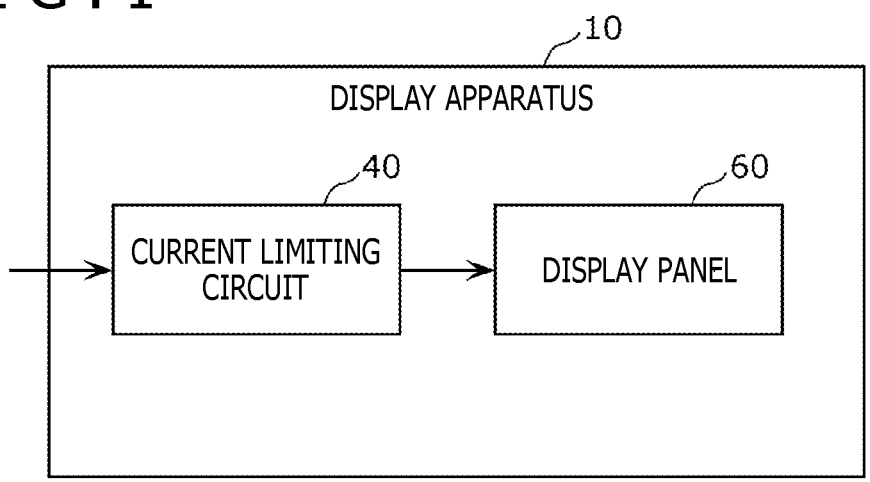
FIG. 1 is a block diagram illustrating a functional configuration of a display apparatus according to an embodiment.

Hereinafter, an embodiment of the present disclosure will be described with reference to the drawings. Note that the embodiment described below illustrates a specific example of the present disclosure. Hence, values, shapes, materials, constituent elements, arrangement positions and connection modes of the constituent elements, steps, orders of the steps, and other matters illustrated in the following embodiment are examples and are not intended to limit the present disclosure. Therefore, the constituent elements not described in the independent claims representing the highest level concept of the present disclosure among the constituent elements in the following embodiment are described as optional constituent elements.

Note that the drawings are schematic diagrams, and the drawings may not be depicted precisely. In addition, the same signs are provided to substantially the same components in the drawings, and duplicate description will be omitted or simplified.

EMBODIMENT

1. Overall Configuration of Display Apparatus

First, an overall configuration of a display apparatus according to an embodiment will be described with reference to FIG. 1. FIG. 1 is a block diagram illustrating a functional configuration of a display apparatus 10 according to the present embodiment. The display apparatus 10 according to the present embodiment is an apparatus that displays a video according to input video signals. As illustrated in FIG. 1, the display apparatus 10 includes a current limiting circuit 40 and a display panel 60. Hereinafter, the current limiting circuit 40 and the display panel 60 will be described.

1-1. Current Limiting Circuit

Figure 2:
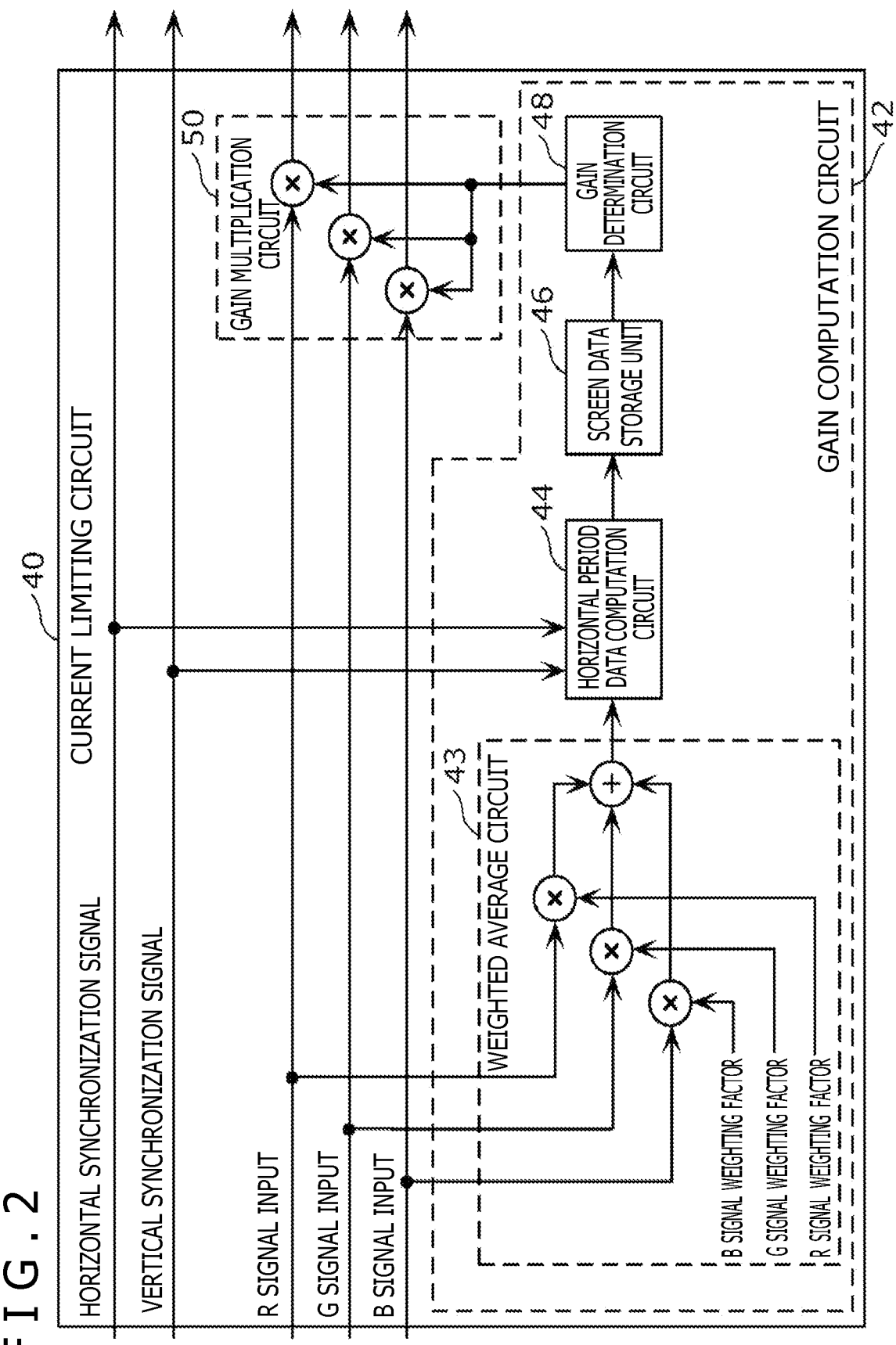
FIG. 2 is a block diagram illustrating a functional configuration of a current limiting circuit included in the display apparatus according to the embodiment.

The current limiting circuit 40 according to the present embodiment will be described with reference to FIG. 2. FIG. 2 is a block diagram illustrating a functional configuration of the current limiting circuit 40 included in the display apparatus 10 according to the present embodiment.

The current limiting circuit 40 is a circuit that limits the current consumption in a plurality of pixels included in the display panel 60. The current limiting circuit 40 limits the current to be supplied to the plurality of pixels, according to the input video signals, to limit the current consumption in the plurality of pixels. In the present embodiment, the current limiting circuit 40 limits the current to be supplied to the plurality of pixels, when a power value supplied to the plurality of pixels exceeds a control target power value. Here, the control target power value is a value set as an upper limit in controlling the power to be supplied to the plurality of pixels included in the display panel 60. Specifically, the current limiting circuit 40 corrects each pixel value included in the video signals and outputs limit signals as corrected video signals to the display panel 60 to limit the current to be supplied to the plurality of pixels. In the present embodiment, the current limiting circuit 40 multiplies each pixel value by a gain determined according to the video signals, to correct each pixel value. The video signals include, for example, RGB signals as signals including pixel values. That is, the video signals include an R signal, a G signal, and a B signal corresponding to the luminance of red, green, and blue, respectively. The video signals further include a horizontal synchronization signal and a vertical synchronization signal. The current limiting circuit 40 includes a gain computation circuit 42 and a gain multiplication circuit 50 as illustrated in FIG. 2.

The gain computation circuit 42 is a circuit that calculates a screen power value corresponding to the power consumption in the plurality of pixels in reference to the pixel values included in the video signals and that determines a gain in reference to the screen power value. In the present embodiment, the gain computation circuit 42 includes a weighted average circuit 43, a horizontal period data computation circuit 44, a screen data storage unit 46, a gain determination circuit 48, and the gain multiplication circuit 50 as illustrated in FIG. 2.

The weighted average circuit 43 is a circuit that calculates a weighted average value of pixel values corresponding to a plurality of subpixels included in each of the plurality of pixels. As illustrated in FIG. 2, the weighted average circuit 43 multiplies the pixel values corresponding to RGB by weighting factors corresponding to the power consumption characteristics of the subpixels and calculates the sum of them as a weighted average value. Note that the weighted average circuit 43 included in the current limiting circuit 40 will also be referred to as a first weighted average circuit to distinguish the weighted average circuit 43 from a weighted average circuit 61 included in the display panel 60 described later.

The horizontal period data computation circuit 44 is a circuit that computes, in each horizontal period, power consumption in each row of the plurality of pixels according to the video signals. In the present embodiment, the horizontal period data computation circuit 44 computes, as the power consumption in each row of the plurality of pixels, horizontal period power conversion data corresponding to the pixel values included in the video signals, in each horizontal period. The horizontal period data computation circuit 44 uses the horizontal synchronization signal and the vertical synchronization signal to calculate, as the horizontal period power conversion data (in other words, level integrated value), an integrated value or an average value of the weighted average values in the horizontal period output by the weighted average circuit 43. Note that the horizontal period data computation circuit 44 included in the current limiting circuit 40 will also be referred to as a first horizontal period data computation circuit to distinguish the horizontal period data computation circuit 44 from a horizontal period data computation circuit 62 included in the display panel 60 described later.

The screen data storage unit 46 is a storage unit that stores the power consumption in each row of the plurality of pixels. In the present embodiment, the screen data storage unit 46 stores, as the power consumption in each row of the plurality of pixels, the horizontal period power conversion data of one frame output by the horizontal period data computation circuit 44. Note that the screen data storage unit 46 included in the current limiting circuit 40 will also be referred to as a first screen data storage unit to distinguish the screen data storage unit 46 from a screen data storage unit 63 included in the display panel 60 described later.

Figure 3:
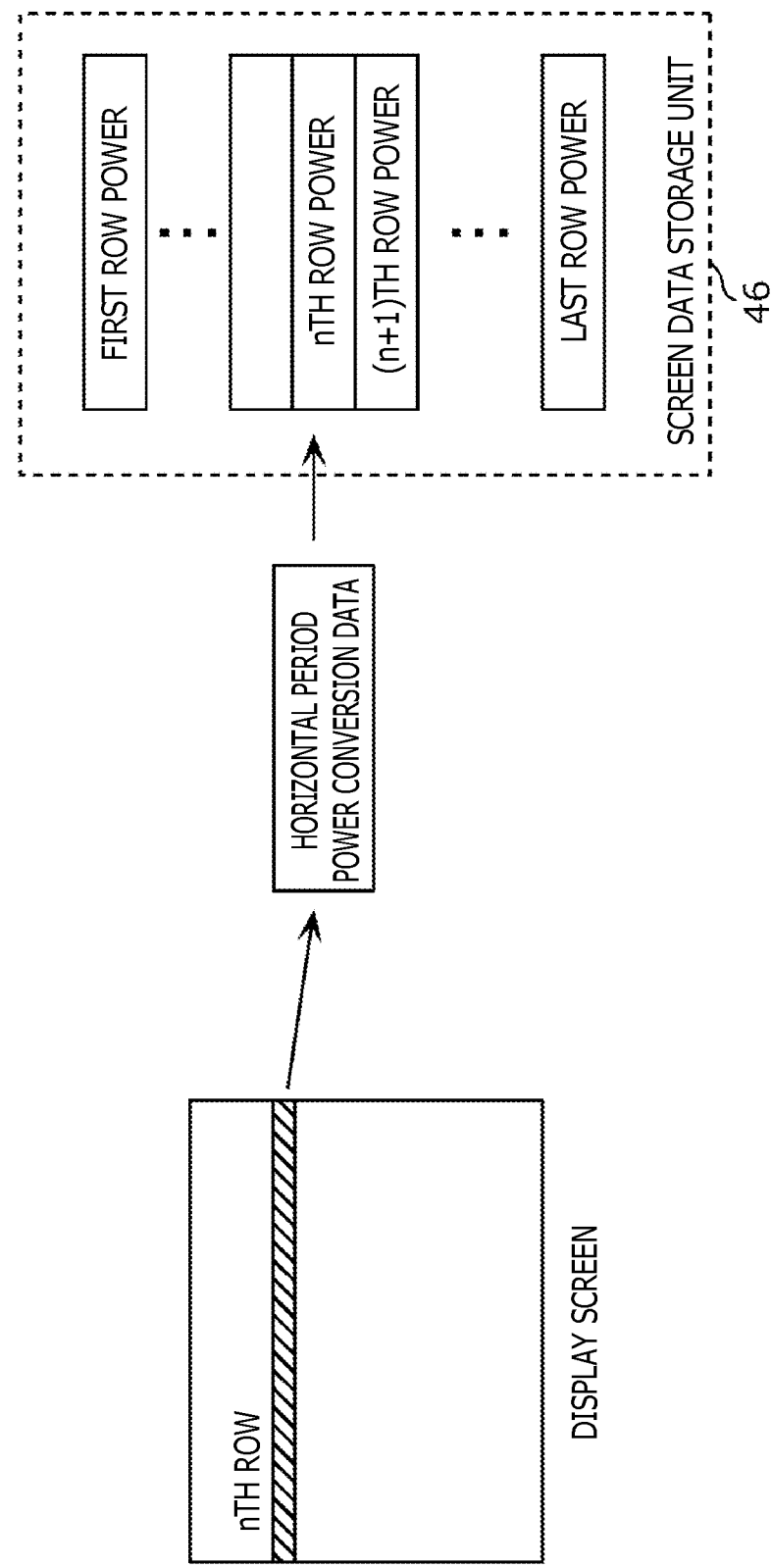
FIG. 3 is a schematic view illustrating a configuration of a screen data storage unit according to the embodiment.

Here, a configuration and an operation of the screen data storage unit 46 will be described with reference to FIG. 3. FIG. 3 is a schematic view illustrating the configuration of the screen data storage unit 46 according to the present embodiment. The screen data storage unit 46 stores the horizontal period power conversion data of one frame, for each row (horizontal line) of the display unit 70. For example, as illustrated in FIG. 3, the horizontal period power conversion data corresponding to an ith row of a display screen displayed on a display unit 70 is stored as a power value of the ith row in the screen data storage unit 46. When rewriting of the next frame is started, the screen data storage unit 46 also newly rewrites, for each row, the power value to be stored and stores the power value as a power value corresponding to the signals written in the display unit 70.

The gain determination circuit 48 is a circuit that calculates a screen power value related to a power consumption value in the plurality of pixels, in reference to the pixel values of the video signals corresponding to the plurality of pixels, and that determines a gain in reference to the screen power value. The gain determination circuit 48 calculates the screen power value corresponding to the power consumption value of one frame in the plurality of pixels, in reference to the power conversion data stored in the screen data storage unit 46. The gain is a value by which each pixel value is multiplied by the gain multiplication circuit 50, and the gain is a value larger than 0 but equal to or smaller than 1. The gain is determined to be a value smaller than 1 when the screen power value exceeds the control target power value. More specifically, when the screen power value exceeds the control target power value, the gain is a value equal to or smaller than a value obtained by dividing the control target power value by the screen power value. The pixel value is multiplied by the gain to limit the power consumption in the plurality of pixels of the display panel 60. In the present embodiment, when the screen power value exceeds the control target power value, the gain is a value obtained by dividing the control target power value by the screen power value. This can suppress reduction of the pixel values more than necessary.

The gain multiplication circuit 50 is a circuit that multiplies the pixel values included in the video signals by the gain and that outputs limit signals including the pixel values multiplied by the gain. That is, the gain multiplication circuit 50 multiplies the pixel values of the video signals corresponding to the plurality of subpixels by the gain determined by the gain determination circuit 48. As a result, when the screen power value exceeds the control target power value, the pixel values included in the video signals are multiplied by the gain smaller than 1, and the luminance of the video signals is reduced. This limits the current to be supplied to the plurality of pixels of the display panel 60. Note that the limit signals output by the gain multiplication circuit 50 may also include signals obtained by multiplying the pixel values included in the video signals by 1 as a gain, that is, the same signals as the video signals.

1-2. Display Panel

Figure 4:
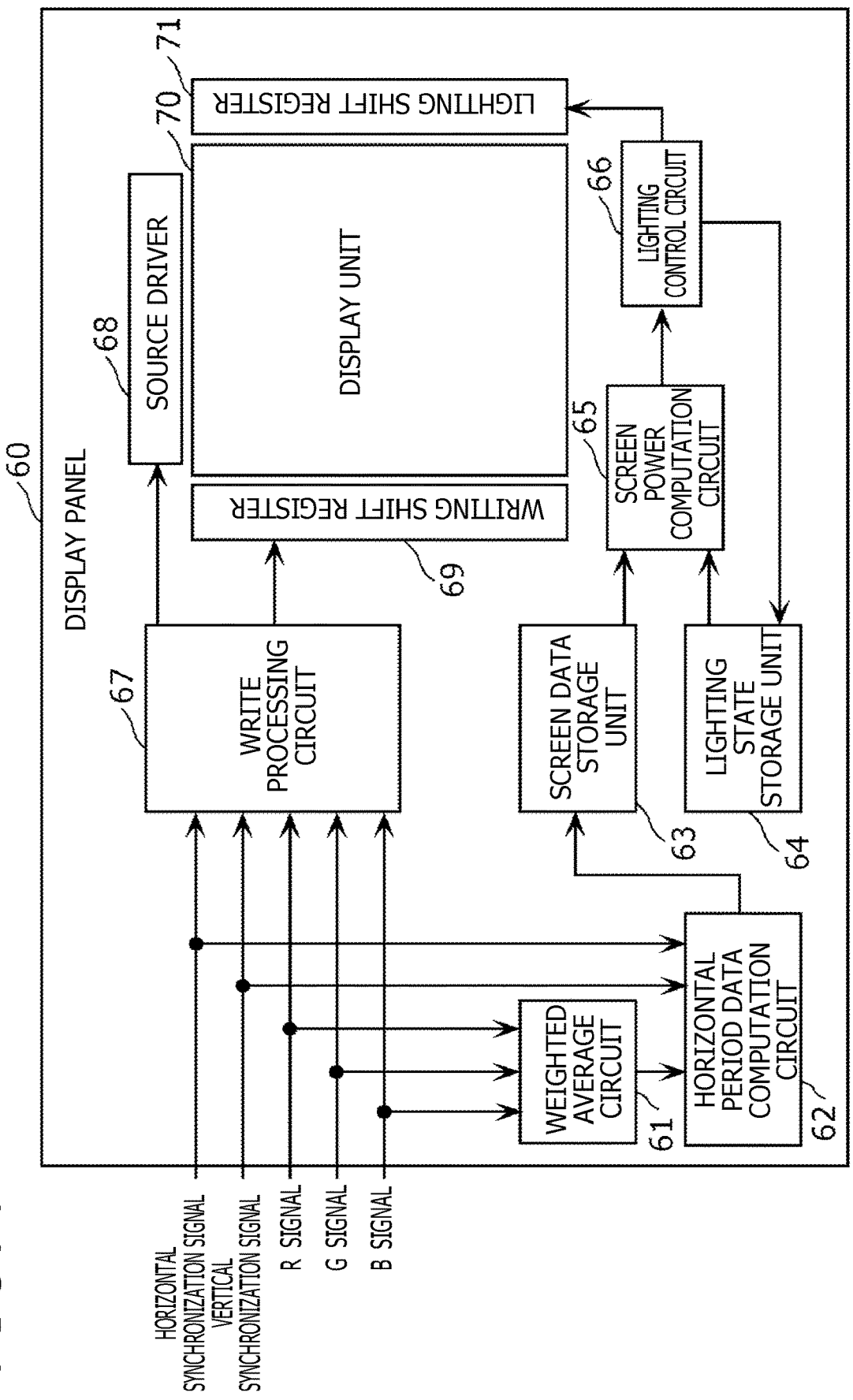
FIG. 4 is a block diagram illustrating a functional configuration of a display panel included in the display apparatus according to the embodiment.

The display panel 60 according to the present embodiment will be described with reference to FIG. 4. FIG. 4 is a block diagram illustrating a functional configuration of the display panel 60 included in the display apparatus 10 according to the present embodiment.

The display panel 60 is a panel that includes a plurality of pixels arranged in a matrix, each of the plurality of pixels including a self-luminous element, and that displays a video according to video signals. The display panel 60 receives limit signals, which are signals obtained by the video signals being corrected, from the current limiting circuit 40 and displays the video according to the limit signals. In the present embodiment, the display panel 60 receives limit signals including corrected RGB signals, horizontal synchronization signals, and vertical synchronization signals. As illustrated in FIG. 4, the display panel 60 includes the display unit 70, the weighted average circuit 61, the horizontal period data computation circuit 62, the screen data storage unit 63, a lighting state storage unit 64, a screen power computation circuit 65, a lighting control circuit 66, a write processing circuit 67, a source driver 68, a writing shift register 69, and a lighting shift register 71.

The display unit 70 includes a plurality of pixels arranged in a matrix and displays a video corresponding to video signals. In the present embodiment, the display unit 70 displays a video corresponding to the limit signals that are corrected video signals.

Figure 5:
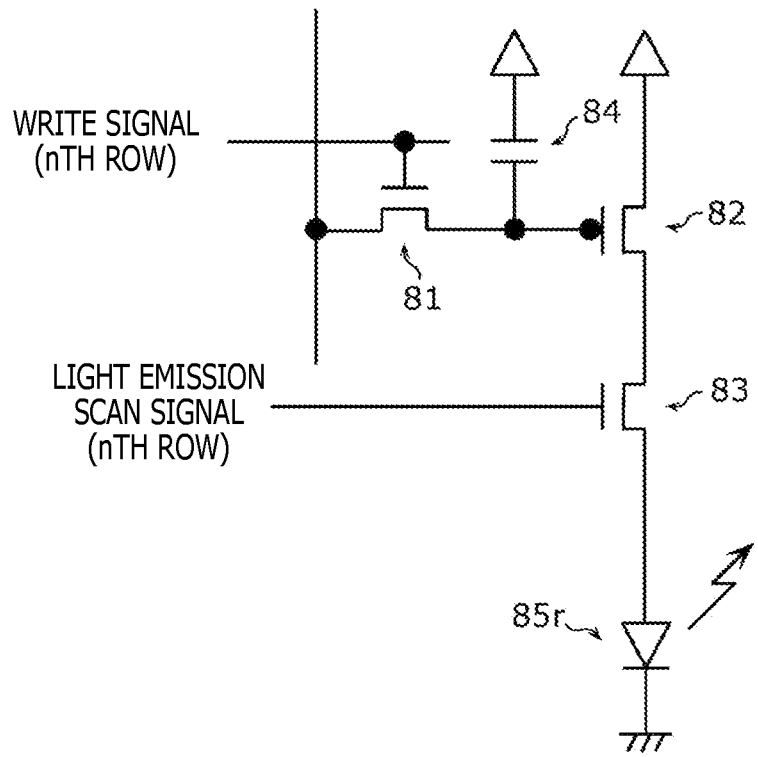
FIG. 5 is a circuit diagram illustrating an example of a configuration of a subpixel included in a pixel according to the embodiment.

Each of the plurality of pixels includes a plurality of subpixels. In the present embodiment, each of the plurality of pixels includes three subpixels corresponding to an R signal, a G signal, and a B signal. Here, a configuration of the subpixel will be described with reference to FIG. 5. FIG. 5 is a circuit diagram illustrating an example of the configuration of the subpixel included in the pixel according to the present embodiment. FIG. 5 illustrates a subpixel in which an organic EL element is used as a self-luminous element 85r. The subpixel illustrated in FIG. 5 is a subpixel for emitting red (R) light. Note that each of the subpixels for emitting green light and blue light also has a circuit configuration similar to the circuit configuration of the circuit illustrated in FIG. 5.

The subpixel includes a TFT (Thin Film Transistor) 81, a capacitor 84, a TFT 82, and the self-luminous element 85r as illustrated in FIG. 5.

A data signal that is an output signal of the source driver 68 is input to one end of the TFT 81. The capacitor 84 is connected to the TFT 81. A control terminal of the TFT 82 is connected to a connection point of the TFT 81 and the capacitor 84. The self-luminous element 85r is connected to the TFT 82.

The TFT 81 is switched on/off according to a write signal that is a control signal output by the writing shift register 69. When the TFT 81 is turned on by a write signal in one horizontal period, a data signal that is a source driver output signal corresponding to a signal level to be written in the pixel is held in the capacitor 84.

After the write signal is turned off, a current corresponding to a voltage held in the capacitor 84 flows through the TFT 82, and the self-luminous element 85r is lit.

Figure 6:
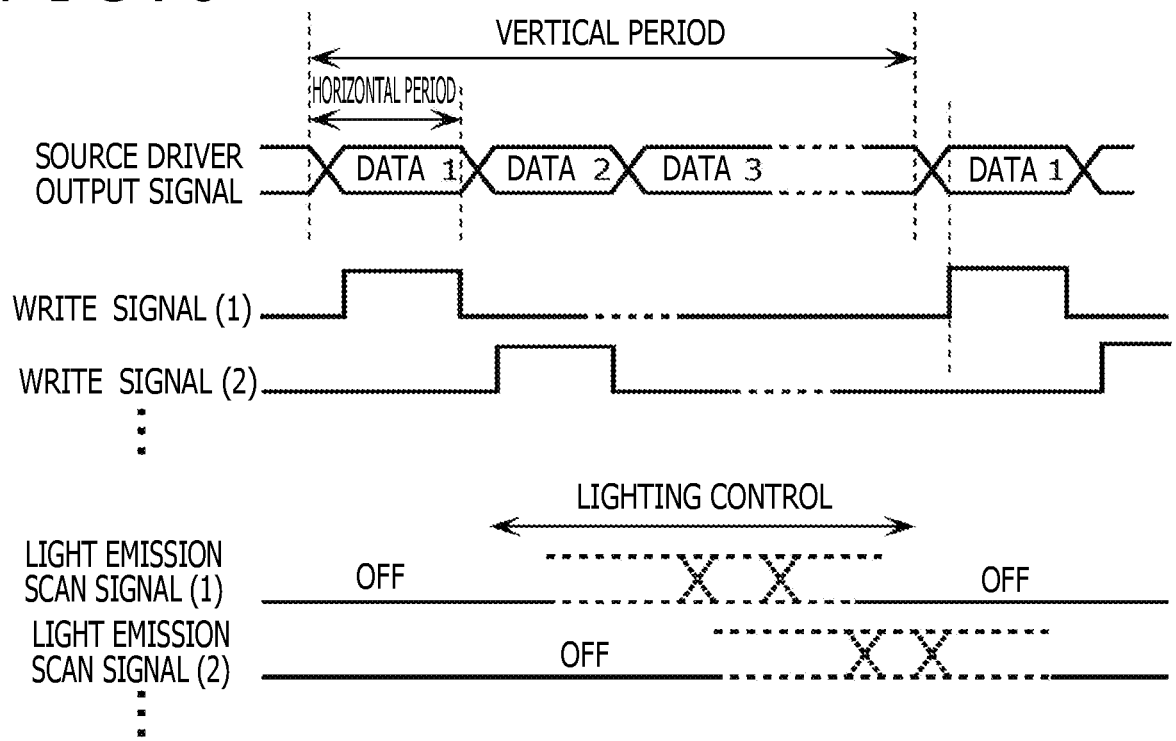
FIG. 6 is a diagram illustrating an example of write signals and light emission scan signals to be input to the subpixel according to the embodiment.

Here, signals input to the subpixel illustrated in FIG. 5 will be described with reference to FIG. 6. FIG. 6 is a diagram illustrating an example of write signals and light emission scan signals to be input to the subpixel according to the present embodiment. The display apparatus 10 uses the write signals to write, in the display unit 70, the data signals output by the source driver 68 and uses the light emission scan signals to emit light on the basis of rows. The display apparatus 10 uses lighting pulses included in the light emission scan signals in the lighting control period, to perform on and off control of the light emission of the pixels on the basis of rows. The on and off control of the light emission of the pixels is performed in each horizontal period. Hereinafter, the lighting pulse that enables the light emission of the pixel included in the light emission scan signal will also be referred to as a light emission signal.

Figure 7:
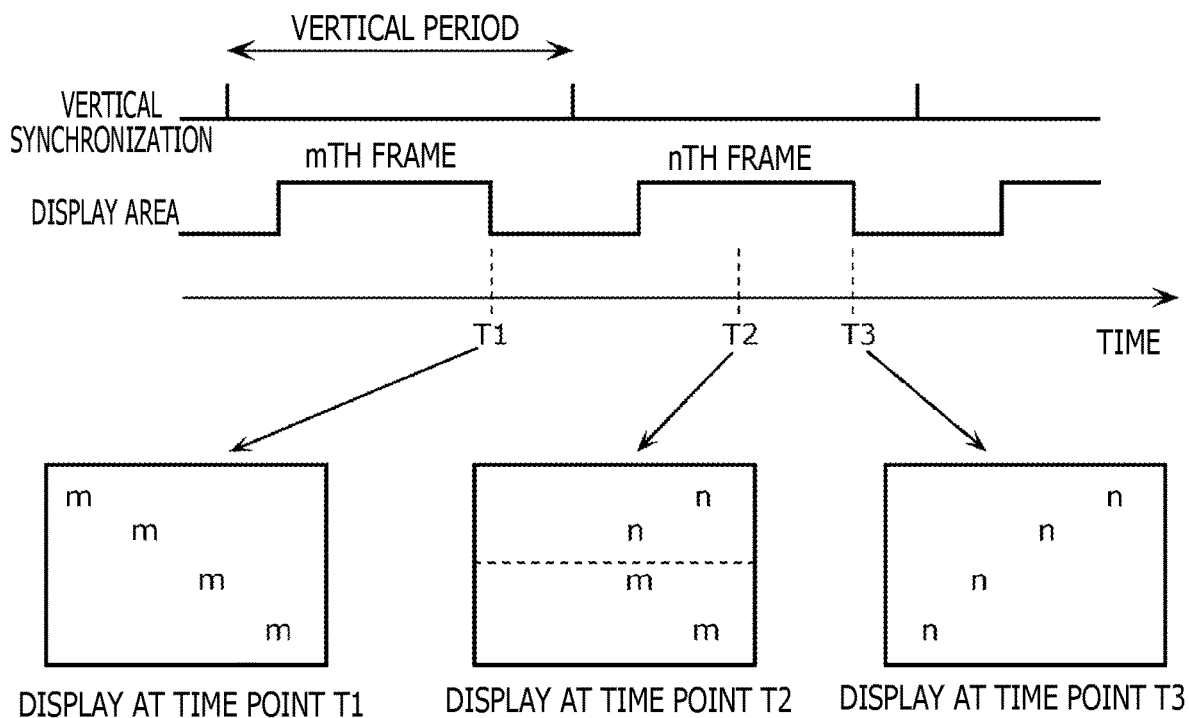
FIG. 7 is a schematic view illustrating transition in display state of a display unit according to the embodiment.

Next, transition in display state of the display unit 70 will be described with reference to FIG. 7. FIG. 7 is a schematic view illustrating transition in display state of the display unit 70 according to the present embodiment. In FIG. 7, the display unit 70 shifts from the display of time point T1 to the display of time point T2 and from the display of time point T2 to the display of time point T3. At time point T1 corresponding to the end of an mth frame illustrated in FIG. 7, the screen of the mth frame is displayed in the display unit 70. Here, the writing shift register 69 that outputs write signals as controls signals for writing the data signals to the pixels outputs the write signals in such a manner as to scan the screen from top to bottom, starting at the head of the display area of the display unit 70. Accordingly, at time point T2 corresponding to the middle of an nth frame (that is, (m+1)th frame) that is a frame following the mth frame, the upper half of the screen switches to the screen of the nth frame, and the lower half remains to be the screen of the mth frame. At time point T3 corresponding to the end of the nth frame, the scan is performed up to the bottom of the display area, and the entire screen switches to the screen of the nth frame.

The weighted average circuit 61 is a circuit that calculates a weighted average value of the pixel values corresponding to the plurality of subpixels included in each of the plurality of pixels, similarly to the weighted average circuit 43 included in the current limiting circuit 40. The weighted average circuit 61 multiplies the pixel values of RGB by weighting factors corresponding to the power consumption characteristics of the subpixels and calculates the sum of them. Note that the weighted average circuit 61 included in the display panel 60 will also be referred to as a second weighted average circuit to distinguish the weighted average circuit 61 from the weighted average circuit 43 included in the current limiting circuit 40.

The horizontal period data computation circuit 62 is a circuit that computes, in each horizontal period, power consumption in each row of the plurality of pixels according to the limit signals, similarly to the horizontal period data computation circuit 44 included in the current limiting circuit 40. In the present embodiment, the horizontal period data computation circuit 62 computes, as the power consumption in each row of the plurality of pixels, horizontal period power conversion data corresponding to the pixel values included in the limit signals, in each horizontal period. The horizontal period data computation circuit 62 uses the horizontal synchronization signal and the vertical synchronization signal to calculate, as the horizontal period power conversion data, an integrated value or an average value of the weighted average values in the horizontal period output by the weighted average circuit 61. Note that the horizontal period data computation circuit 62 included in the display panel 60 will also be referred to as a second horizontal period data computation circuit to distinguish the horizontal period data computation circuit 62 from the horizontal period data computation circuit 44 included in the current limiting circuit 40.

The screen data storage unit 63 is a storage unit that stores the power consumption in each row of the plurality of pixels. In the present embodiment, the screen data storage unit 63 stores, as the power consumption in each row of the plurality of pixels, the horizontal period power conversion data of one frame output by the horizontal period data computation circuit 62. Note that the screen data storage unit 63 included in the display panel 60 will also be referred to as a second screen data storage unit to distinguish the screen data storage unit 63 from the screen data storage unit 46 included in the current limiting circuit 40.

The lighting state storage unit 64 is a storage unit that stores a lighting control signal output from the lighting control circuit 66. The lighting state storage unit 64 stores the lighting state of the plurality of pixels of the display unit 70 corresponding to one frame. The lighting state storage unit 64 receives the lighting control signal from the lighting control circuit 66 and stores the lighting state of one frame in the display unit 70 according to the lighting control signal.

The screen power computation circuit 65 is a circuit that computes a predicted power value corresponding to the power predicted to be consumed in the plurality of pixels of the display unit 70, the predicted power value being computed according to the limit signals. In the present embodiment, the screen power computation circuit 65 computes the predicted power value according to the power consumption in each row of the plurality of pixels stored in the screen data storage unit 63 and the lighting control signal stored in the lighting state storage unit 64.

The lighting control circuit 66 is a circuit that controls the lighting state of the plurality of pixels in reference to the predicted power value to reduce the power consumption value in the plurality of pixels to a value equal to or smaller than the control target power value. In the present embodiment, the lighting control circuit 66 compares the predicted power value output from the screen power computation circuit 65 and the control target power value and outputs a lighting control signal corresponding to the comparison result to the lighting shift register 71 and the lighting state storage unit 64 in each horizontal period.

The write processing circuit 67 is a circuit that outputs control signals for writing the pixel values included in the limit signals (that is, pixel values corrected by the current limiting circuit 40) to the display unit 70 and data signals corresponding to the pixel values. The write processing circuit 67 outputs the control signals to the writing shift register 69 and outputs the data signals to the source driver 68.

The source driver 68 is a circuit that outputs the data signals to the display unit 70.

The writing shift register 69 is a shift register that outputs, to the display unit 70, write signals as control signals for writing the data signals to the display unit 70.

The lighting shift register 71 is a shift register that outputs, to the display unit 70, a light emission signal for enabling light emission of a plurality of pixels of the display unit 70. The lighting shift register 71 outputs the light emission signal according to the lighting control signal from the lighting control circuit 66. In the present embodiment, the lighting shift register 71 outputs the light emission signal for each row of a plurality of pixels arranged in a matrix. The light emission signal is a signal that enables light emission of a plurality of pixels, and the pixels included in the row provided with the light emission signal can emit light with luminance corresponding to the pixel values included in the limit signal. On the other hand, the pixels included in the row not provided with the light emission signal cannot emit light.

2. Current Limiting Method

Figure 8:
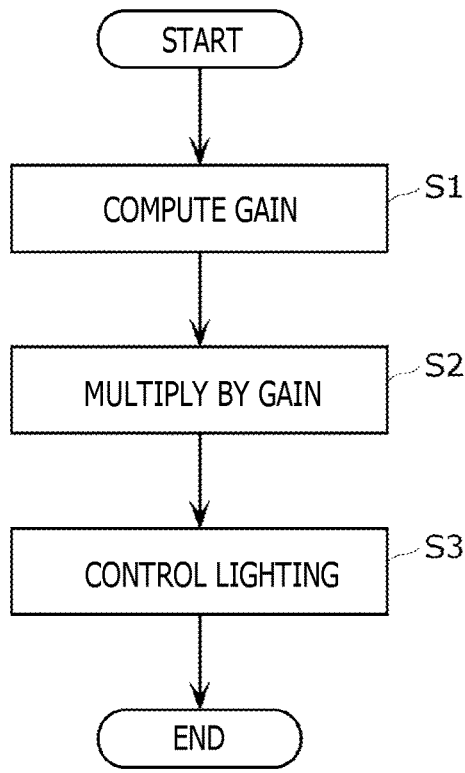
FIG. 8 is a flow chart illustrating a flow of a current limiting method used in the display apparatus according to the embodiment.

Next, a current limiting method used in the display apparatus 10 according to the present embodiment will be described with reference to FIG. 8. FIG. 8 is a flow chart illustrating a flow of the current limiting method used in the display apparatus 10 according to the present embodiment.

Figure 9:
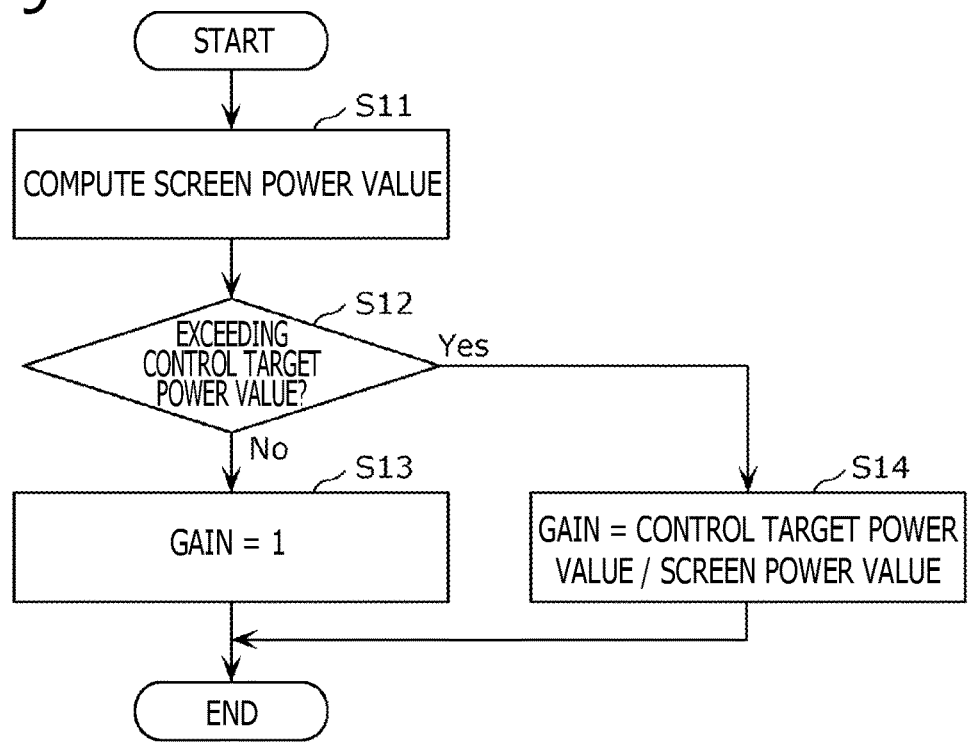
FIG. 9 is a flow chart illustrating a flow of a gain computation method according to the embodiment.

As illustrated in FIG. 8, the current limiting circuit 40 of the display apparatus 10 first performs gain computation (S1). More specifically, the current limiting circuit 40 calculates a screen power value corresponding to the power consumption in the plurality of pixels in reference to the pixel values included in the video signals corresponding to the plurality of pixels and determines a gain in reference to the screen power value. Hereinafter, the gain computation step S1 will be described in detail with reference to FIG. 9. FIG. 9 is a flow chart illustrating a flow of the gain computation method according to the present embodiment.

As illustrated in FIG. 9, the current limiting circuit 40 computes a screen power value in the gain computation step S1 (S11). Hereinafter, the operation of the current limiting circuit 40 in the screen power value computation step S11 will be described.

As illustrated in FIG. 2, video signals are input to the current limiting circuit 40. In the present embodiment, the video signals include an R signal, a G signal, a B signal, a horizontal synchronization signal, and a vertical synchronization signal. The video signals are input to the gain computation circuit 42 included in the current limiting circuit 40.

The R signal, the G signal, and the B signal corresponding to the pixel values among the video signals are input to the weighted average circuit 43 included in the gain computation circuit 42. The weighted average circuit 43 calculates a weighted average value of the pixel values corresponding to the plurality of subpixels included in each of the plurality of pixels. Specifically, the weighted average circuit 43 multiplies the R signal, the G signal, and the B signal by an R signal weighting factor, a G signal weighting factor, and a B signal weighting factor, respectively, and calculates the sum of them. Then, the weighted average circuit 43 outputs the calculated sum to the horizontal period data computation circuit 44.

The horizontal period data computation circuit 44 uses the horizontal synchronization signal and the vertical synchronization signal to calculate, as horizontal period power conversion data, an integrated value or an average value of the weighted average values in the horizontal period output by the weighted average circuit 43.

The horizontal period data computation circuit 44 outputs the calculated horizontal period power conversion data to the screen data storage unit 46.

Next, the gain determination circuit 48 of the gain computation circuit 42 computes a screen power value based on the horizontal period power conversion data stored in the screen data storage unit 46. Specifically, the gain determination circuit 48 calculates, as the screen power value, the sum of the horizontal period power conversion data of the number of rows (that is, the number of horizontal lines) stored in the screen data storage unit 46.

Then, the gain determination circuit 48 determines whether or not the calculated screen power value exceeds a preset control target power value (S12 of FIG. 9). The gain determination circuit 48 determines that the gain is 1 when the screen power value does not exceed the control target power value (S13 of FIG. 9). On the other hand, the gain determination circuit 48 determines that the gain is a ratio of the control target power value to the screen power value when the scree power value exceeds the control target power value (S14 of FIG. 9).

In this way, the gain is computed by the gain computation circuit 42. The computed gain is input to the gain multiplication circuit 50.

Next, described with reference to FIG. 8 again, the gain multiplication circuit 50 of the current limiting circuit 40 multiplies the pixel values included in the video signals by the gain and outputs limit signals including the pixel values multiplied by the gain (S2). Specifically, the gain multiplication circuit 50 multiplies each of the R signal, the G signal, and the B signal by the gain. The current limiting circuit 40 outputs, as the limit signals, the signals including the pixel values corrected by the pixel values being multiplied by the gain to the display panel 60. That is, the current limiting circuit 40 outputs, to the display panel 60, the limit signals including the R signal, the G signal, and the B signal multiplied by the gain, the horizontal synchronization signal, and the vertical synchronization signal.

Figure 10:
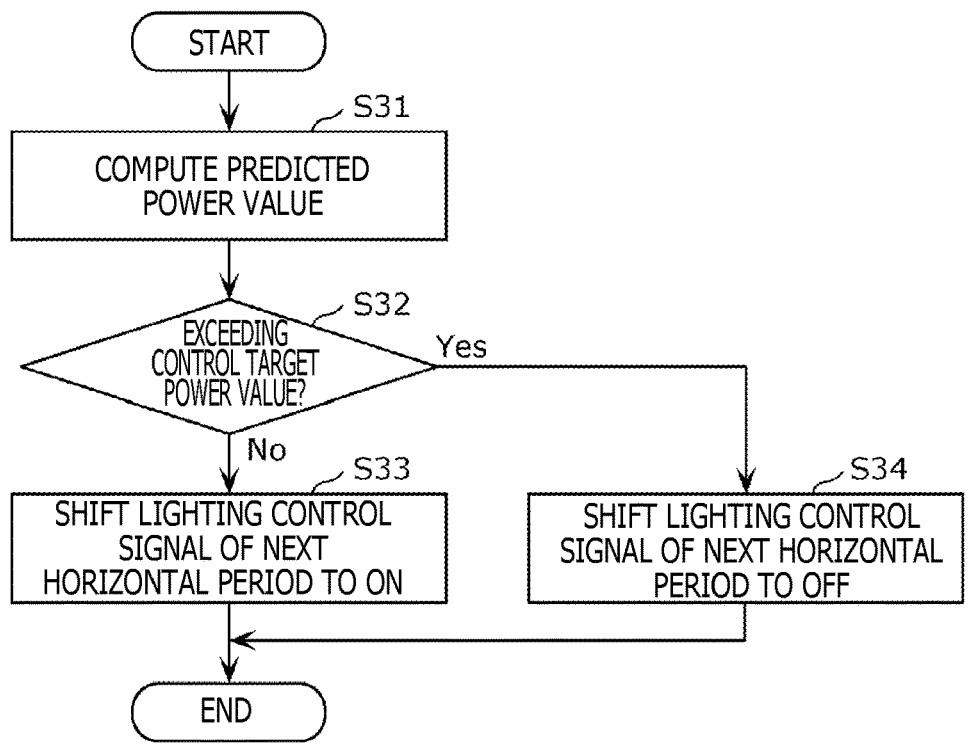
FIG. 10 is a flow chart illustrating a flow of a lighting control method according to the embodiment.

Next, the display panel 60 performs lighting control of the plurality of pixels (S3). Specifically, the display panel 60 controls the lighting state of the plurality of pixels in reference to a predicted power value corresponding to the power predicted to be consumed by the plurality of pixels, the predicted power value being computed according to the limit signals, to reduce the power consumption value in the plurality of pixels to a value equal to or smaller than the control target power value. Hereinafter, the lighting control step S3 will be described in detail with reference to FIG. 10. FIG. 10 is a flow chart illustrating a flow of the lighting control method according to the present embodiment.

First, a predicted power value corresponding to the power predicted to be consumed in the plurality of pixels is computed (S31 of FIG. 10). To compute the predicted power value, the weighted average circuit 61 and the horizontal period data computation circuit 62 of the display panel 60 first compute the horizontal period power conversion data corresponding to the limit signals, similarly to the weighted average circuit 43 and the horizontal period data computation circuit 44 of the current limiting circuit 40. Next, the computed horizontal period power conversion data is stored in the screen data storage unit 63. In this way, the horizontal period power conversion data corresponding to the pixel values written in the display unit 70 by the write processing circuit 67, the source driver 68, and the writing shift register 69 is stored in the screen data storage unit 63.

Figure 11:
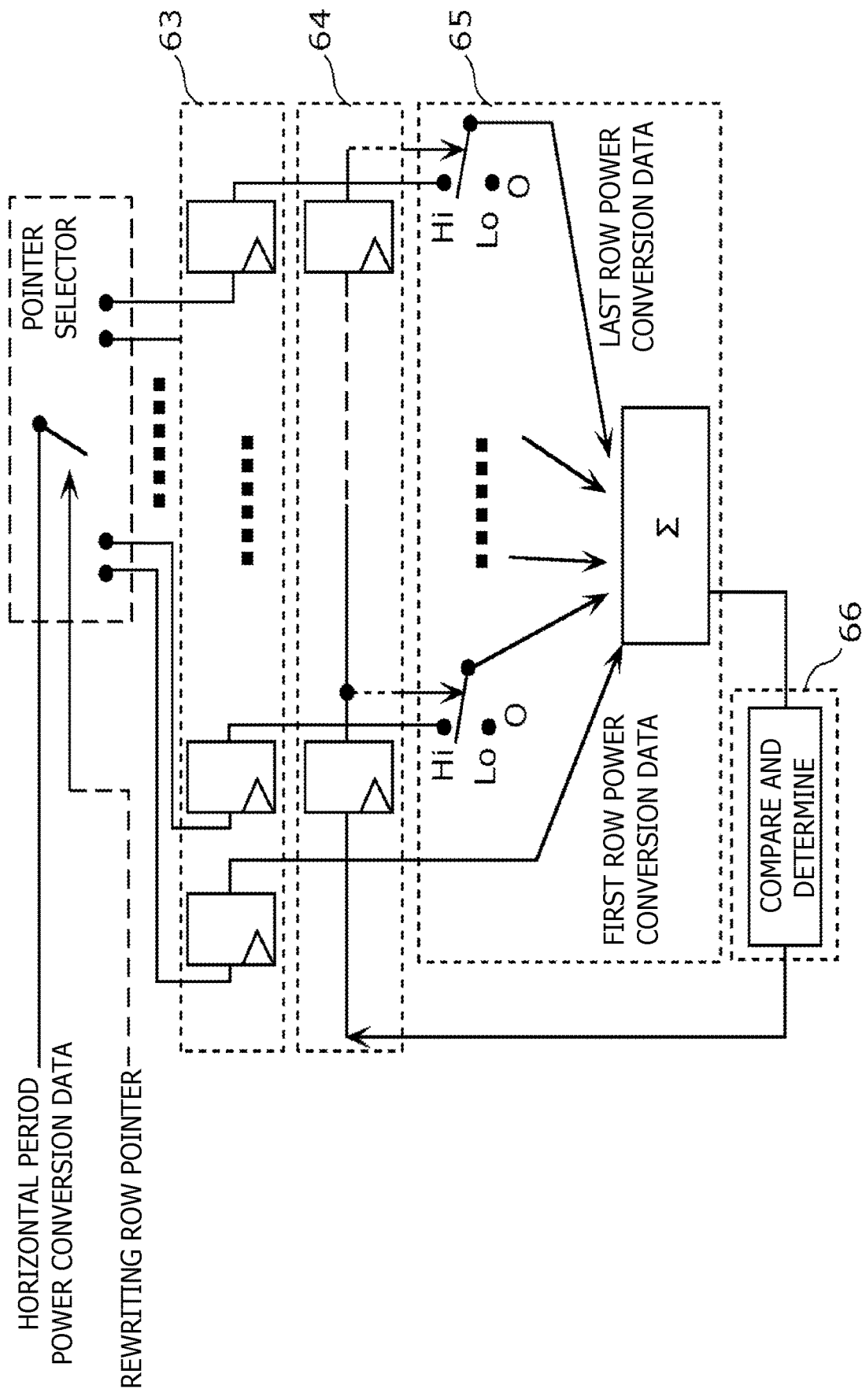
FIG. 11 is a schematic view illustrating an example of a circuit configuration of a screen power computation circuit according to the embodiment.

Then, the screen power computation circuit 65 computes a predicted power value according to the horizontal period power conversion data stored in the screen data storage unit 63 and the lighting control signal stored in the lighting state storage unit 64. Here, the operation of the screen power computation circuit 65 will be described with reference to FIG. 11. FIG. 11 is a schematic view illustrating an example of a circuit configuration of the screen power computation circuit 65 according to the present embodiment. FIG. 11 also illustrates the screen data storage unit 63, the lighting state storage unit 64, and the lighting control circuit 66 along with the screen power computation circuit 65.

As illustrated in FIG. 11, the horizontal period power conversion data corresponding to one row of the plurality of pixels output from the horizontal period data computation circuit 62 is input to a pointer selector. A rewriting row pointer in the pointer selector inputs the horizontal period power conversion data to a register corresponding to the relevant one row in the screen data storage unit 63. In this way, the horizontal period power conversion data corresponding to the pixel values to be written in the display unit 70 in the next horizontal period is written in the register corresponding to the relevant one row in the screen data storage unit 63.

In the present embodiment, lighting control signals indicating the lighting state of the plurality of pixels from the second row to the last row in the next horizontal period are stored in the lighting state storage unit 64. The lighting control signals indicating the lighting state of the plurality of pixels from the second row to the last row in the next horizontal period each correspond to the lighting control signals of the plurality of pixels from the first row to the row immediately prior to the last row in the current horizontal period (that is, horizontal period immediately prior to the next horizontal period), respectively. That is, the lighting control signals of the plurality of pixels from the first row to the row immediately prior to the last row in the current horizontal period are shifted to the lighting control signals from the second row to the last row in the next horizontal period.

The screen power computation circuit 65 integrates the horizontal period power conversion data of the first row and the horizontal period power conversion data of only the rows in which the lighting state stored in the lighting state storage unit 64 is on and which are among the second row to the last row, which are among the pieces of horizontal period power conversion data stored in the screen data storage unit 63, to thereby compute the predicted power value of the next horizontal period. In the circuit configuration example illustrated in FIG. 11, the numbers of input terminals Hi and low level terminals Lo included in the screen power computation circuit 65 are equal to the number of rows of the plurality of pixels minus one. The horizontal period power conversion data corresponding to each row from the second row to the last row of the screen data storage unit 63 is input to each input terminal Hi. Each low level terminal Lo is maintained at potential of a Low level. For each pair of an input terminal Hi and a low level terminal Lo, the screen power computation circuit 65 includes a switch selectively connected to one of the terminals according to the lighting state (that is, a state indicated by lighting control signal) of the corresponding row of the lighting state storage unit 64. Each switch is connected to the input terminal Hi when the lighting control signal indicates a lighting state, and each switch is connected to the low level terminal Lo when the lighting control signal indicates a non-lighting state. Each switch is connected to an integration circuit. The screen power computation circuit 65 with such a configuration can integrate the horizontal period power conversion data of the first row and the horizontal period power conversion data of only the rows in which the lighting state is on, which are among the pieces of horizontal period power conversion data stored in the screen data storage unit 63, to thereby compute the predicted power value.

Then, the lighting control circuit 66 determines whether or not the predicted power value computed by the screen power computation circuit 65 exceeds the control target power value (S32 of FIG. 10). If the predicted power value does not exceed the control target power value (No in S32 of FIG. 10), the lighting control circuit 66 shifts the lighting control signal of the first row of the next horizontal period to on (S33). That is, the lighting control circuit 66 outputs a signal for controlling the first row to put the first row into the lighting state. On the other hand, if the predicted power value exceeds the control target power value (Yes in S32 of FIG. 10), the lighting control circuit 66 shifts the lighting control signal of the first row of the next horizontal period to off (S34). That is, the lighting control circuit 66 outputs a signal for controlling the first row to put the first row into the non-lighting state (that is, a turn-off state). The lighting control circuit 66 determines the lighting control signal of the first row in this way and inputs the lighting control signal to the lighting state storage unit 64. As a result, the lighting control signals stored in the lighting state storage unit 64 are shifted by one row each. That is, the lighting control signal of an Nth row is shifted to the lighting control signal of an (N+1)th row.

In addition, the lighting control circuit 66 uses the method described above to output the lighting control signal corresponding also to the first row to the lighting shift register 71. As a result, the power consumption value in the plurality of pixels of the next horizontal period can be controlled to a value equal to or smaller than the control target power value.

3. Operation Example

Next, an operation example of the display apparatus 10 according to the present embodiment will be described.

3-1. Operation Example of Current Limiting Circuit

Figure 12A:
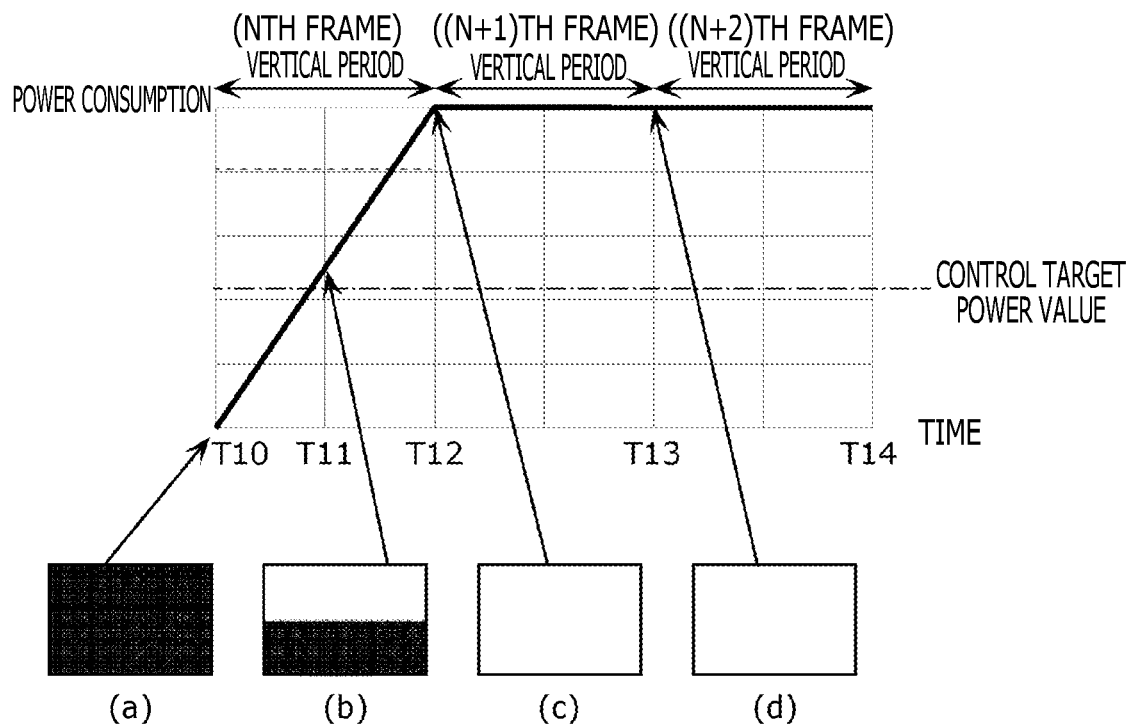
FIG. 12A is a graph illustrating a time waveform of a power consumption value in a plurality of pixels corresponding to video signals supplied to a display panel when a display apparatus of a comparison example changes from all-black display to all-white display.
Figure 12B:
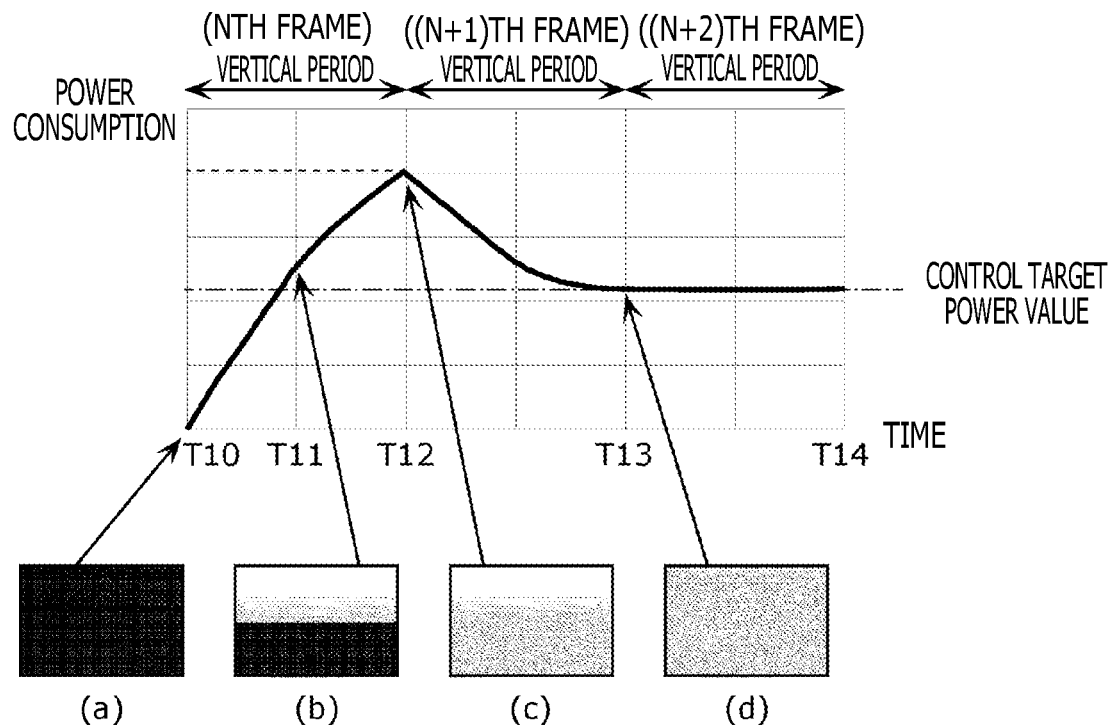
FIG. 12B is a graph illustrating a time waveform of a power consumption value in a plurality of pixels corresponding to limit signals supplied to the display panel when the display apparatus according to the present embodiment changes from all-black display to all-white display.

First, an operation example of the current limiting circuit 40 will be described with reference to FIGS. 12A and 12B. FIG. 12A is a graph illustrating a time waveform of the power consumption value in the plurality of pixels corresponding to the video signals supplied to the display panel 60 when a display apparatus of a comparison example changes from all-black display to all-white display. FIG. 12B is a graph illustrating a time waveform of the power consumption value in the plurality of pixels corresponding to the limit signals supplied to the display panel 60 when the display apparatus 10 according to the present embodiment changes from all-black display to all-white display. Here, the display apparatus of the comparison example is a display apparatus with a configuration similar to that of the display apparatus 10 except that the display apparatus does not include the current limiting circuit 40. In the examples illustrated in FIGS. 12A and 12B, the display state of the display unit 70 is changed from all-black display to all-white display in an Nth frame, and then the all-white display is maintained in an (N+1)th frame and an (N+2)th frame following the Nth frame. FIGS. 12A and 12B also illustrate images (a) to (d) displayed on the display unit 70 at respective time points. Note that an effect of suppression of power consumption obtained when the lighting control circuit 66 of the display panel 60 turns off the plurality of pixels is not taken into account in the examples illustrated in FIGS. 12A and 12B.

As illustrated in the images (a) of FIGS. 12A and 12B, the display unit 70 is in the all-black display state in both display apparatuses at time point T10 on the left ends of the graphs in FIGS. 12A and 12B. In this case, the current supplied to the plurality of pixels of the display unit 70 is substantially zero. Subsequently, when video signals indicating all-white display are input to the display apparatus, the black display is sequentially switched to the white display in the horizontal periods of the display unit 70, from the row on the upper end of the display unit 70.

In the display apparatus of the comparison example, the upper half of the display unit 70 is switched to the white display at time point T11, which is ½ the vertical period (that is, vertical synchronization cycle) after time point T10, and the entire display unit 70 is switched to the white display at time point T12, which is 1 vertical period after time point T10, as illustrated in the images (b) and (c) of FIG. 12A. In the display apparatus of the comparison example, the white display of the entire display unit 70 is maintained up to time point T13, which is 1 vertical period from time point T12, and up to time point T14, which is another 1 vertical period after time point T13, as illustrated in the image (d) of FIG. 12A.

On the other hand, in the display apparatus 10 according to the present embodiment, the rows near the upper end are switched to the white display as indicated in the video signals, when the black display is sequentially switched to the white display from the row on the upper end of the display unit 70. However, the power value supplied to the plurality of pixels exceeds the control target power value in the middle of the switch to the white display from the row on the upper end to the row on the lower end. When the power value supplied to the plurality of pixels exceeds the control target power value in this way, the current limiting circuit 40 multiplies the pixel values included in the video signals by the gain smaller than 1 as described above. This limits the power to be supplied to the plurality of pixels.

For example, at time point T11 of FIG. 12B, the rows arranged in the region of the upper half of the display unit 70 are switched from the black display to the white display. In this state, the current limiting circuit 40 reduces the luminance of the video signals as illustrated in the image (b) of FIG. 12B, and the luminance of the white display thus gradually decreases from the row on the upper end of the plurality of pixels toward the lower rows. Specifically, although the row on the upper end of the display unit 70 is displayed in white as indicated in the video signals, the row arranged on the lowermost side among the rows displayed in white in the image (b) of FIG. 12B (that is, the row positioned in the middle of the display unit 70 in the vertical direction) is displayed in white with lower luminance than the luminance indicated in the video signals (that is, displayed in gray). Subsequently, the pixels arranged in the rows on the lower half of the display unit 70 are also displayed in white with lower luminance than the luminance indicated in the video signals. As a result, at time point T12 after 1 vertical period from time point T10, the display unit 70 shifts to all-white display in which the luminance gradually decreases toward the lower end of the display unit 70 as illustrated in the image (c) of FIG. 12B. At time point T12, the rows near the upper end of the display unit 70 are displayed in white with the luminance indicated in the video signals, and the amount of current supplied to the entire pixels exceeds the current upper limit.

The current supplied to the plurality of pixels by the current limiting circuit 40 is also limited during 1 vertical period from time point T12. As a result, all rows are displayed in all-white with lower luminance than the luminance indicated in the video signals at time point T13 which is 1 vertical period after time point T12. As a result, the power value supplied to the plurality of pixels after time point T13 is limited to a value equal to or smaller than the control target power value.

In this way, although the power value supplied to the plurality of pixels in the display apparatus 10 according to the present embodiment temporarily exceeds the control target power value, the current limiting circuit 40 substantially suppresses the power value to a value equal to or smaller than the control target power value.

3-2. Operation Example of Display Panel

Next, an operation example of the display panel 60 will be described. Here, to facilitate the understanding of the operation of the display panel 60, an operation of the display panel 60 of a case in which the display apparatus 10 does not include the current limiting circuit 40 (that is, an operation of a case in which the video signals are input to the display panel 60 without being corrected) will be described with reference to FIGS. 13 and 14.

Figure 13:
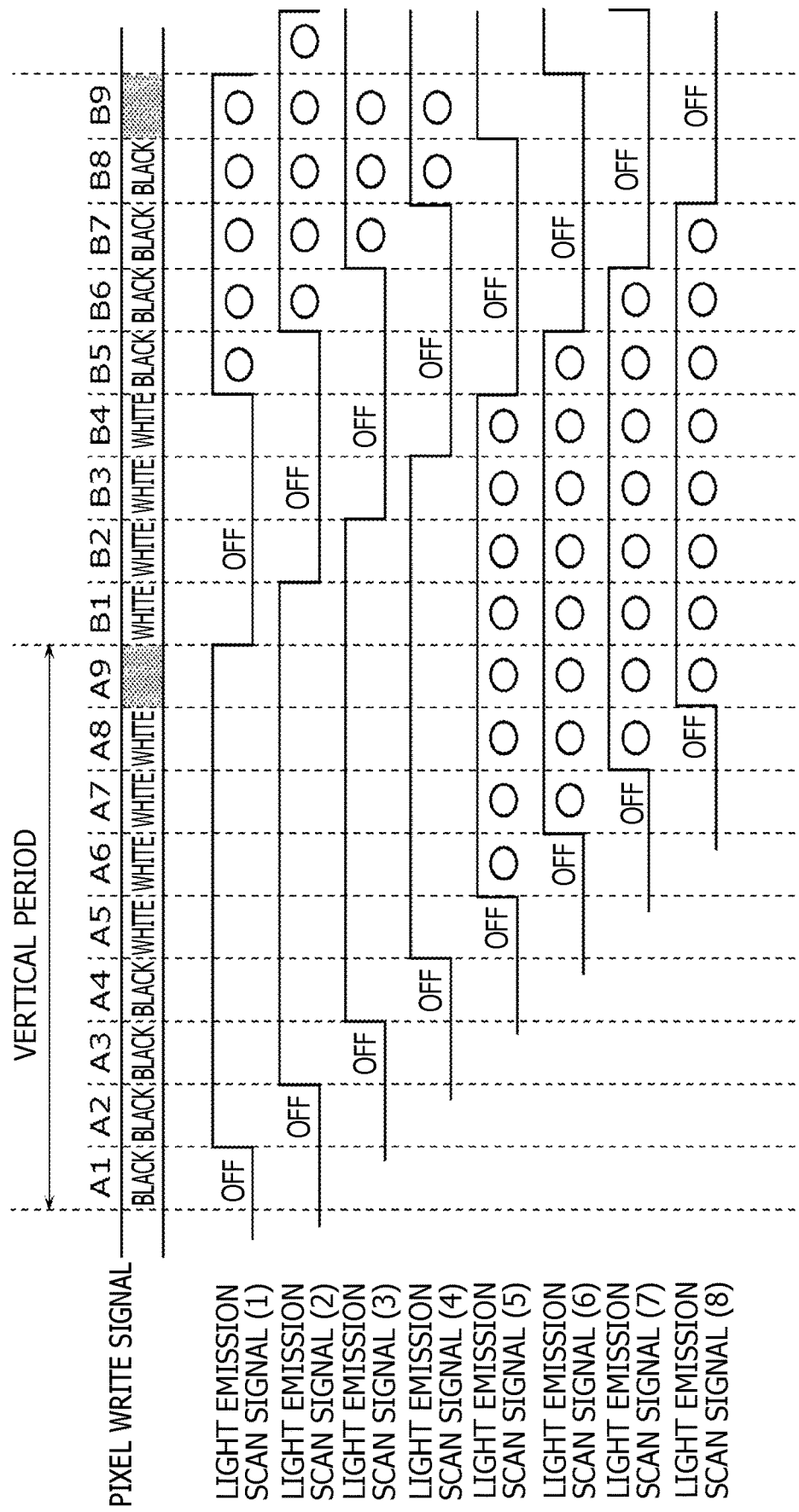
FIG. 13 is a diagram illustrating transition in lighting state of each row of the plurality of pixels of the display panel in each horizontal period according to the present embodiment.

FIG. 13 is a diagram illustrating transition in lighting state of each row of the plurality of pixels of the display panel 60 in each horizontal period according to the present embodiment. FIG. 13 illustrates an example of performing control by setting the control target power value to 50% of the all-white display when the plurality of pixels include eight rows. In a frame corresponding to the pixel values written to the display unit 70 in a vertical period including horizontal periods A1 to A9 illustrated in FIG. 13, the upper half (that is, first to fourth rows) of the display unit 70 is displayed in black, and the lower half (that is, fifth to eighth rows) is displayed in white. In addition, in a frame corresponding to the pixel values written to the display unit 70 in a vertical period including horizontal periods B1 to B9 illustrated in FIG. 13, the upper half (that is, first to fourth rows) of the display unit 70 is displayed in white, and the lower half (that is, fifth to eighth rows) is displayed in black.

In FIG. 13, a high level part of light emission scan signals (1) to (8) represents a state in which the light can be emitted (that is, a state in which the light emission signal is output from the lighting shift register 71), and a low level part represents a non-lighting state. In addition, circles illustrated in FIG. 13 indicate that the light is emitted.

The lighting shift register 71 outputs the light emission scan signals (1) to (8) to the display unit 70 when the lighting control signal is input from the lighting control circuit 66. For example, the pixels of the fifth to eighth rows are in the white display state in the horizontal periods B2 to B4. Accordingly, when the pixels of the first row are put into the lighting state, the power consumption value in the plurality of pixels exceeds the control target power value (50% of all-white display). Hence, the lighting control circuit 66 outputs the light emission scan signal (1) indicating the non-lighting state to the display unit 70 in the horizontal periods B2 to B4. On the other hand, the pixels of the fifth row are turned off in the horizontal period B5, and the power consumption value in the plurality of pixels does not exceed the control target power value even if the pixels of the first row are put into the white display state. Hence, the lighting control circuit 66 outputs the light emission scan signal (1) indicating the lighting state to the display unit 70 in the horizontal period B5.

Figure 14:
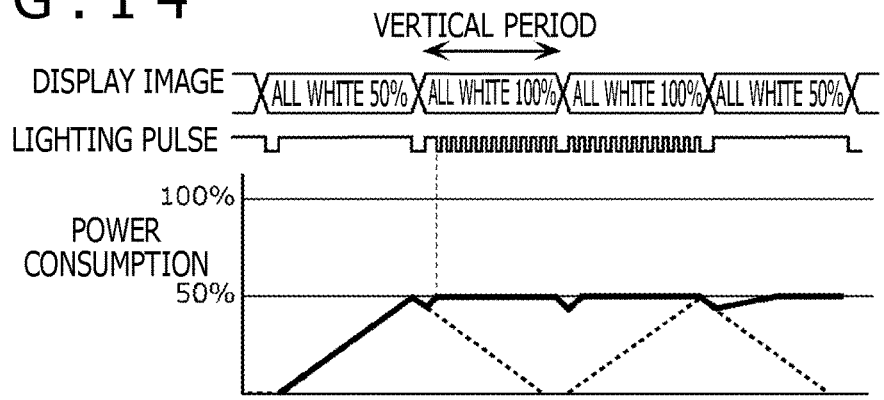
FIG. 14 is a graph illustrating a relation between the power consumption value in the plurality of pixels of the display panel and a display image according to the present embodiment.

Next, the power consumption in the display panel 60 according to the present embodiment will be described with reference to FIG. 14. FIG. 14 is a graph illustrating a relation between the power consumption value in the plurality of pixels of the display panel 60 and the display image according to the present embodiment. Here, the control target power value is also 50% of the all-white display. The example illustrated in FIG. 14 represents a state in which a screen with white level (that is, luminance of white display) of 50% in all-white display changes to a screen with white level of 100% in all-white display and then, the screen with white level of 100% in all-white display shifts to the screen with white level of 50% in all-white display.

As illustrated in FIG. 14, even in the vertical period of displaying the screen with white level of 100% in all-white display, the lighting control for setting the light emission duty of lighting pulse (that is, light emission signal) to 50% can also be performed to prevent the power consumption value from exceeding 50%.

4. Advantageous Effect

Figure 15A:
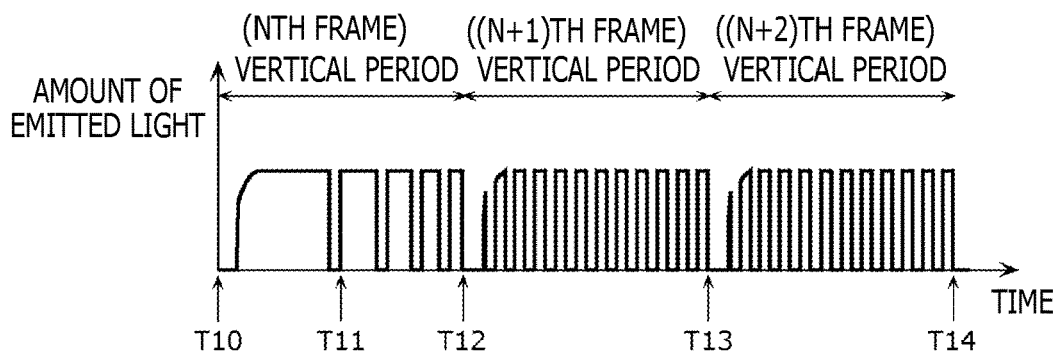
FIG. 15A is a graph schematically illustrating a time waveform example of an amount of emitted light of the pixels included in a display unit of the display apparatus of the comparison example.
Figure 15B:
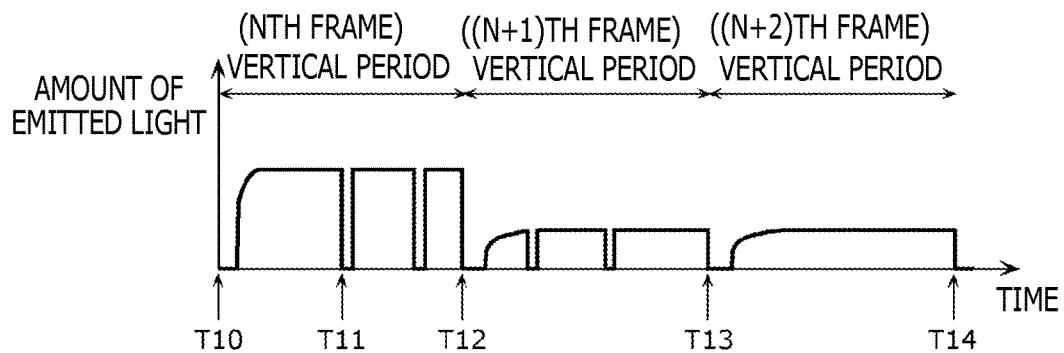
FIG. 15B is a graph schematically illustrating a time waveform example of an amount of emitted light of the pixels included in the display unit of the display apparatus according to the embodiment.

Next, an advantageous effect of the display apparatus 10 according to the present embodiment will be described with reference to FIGS. 12A, 12B, 15A, 15B, and 16. FIGS. 15A and 15B are graphs each schematically illustrating time waveform examples of an amount of emitted light of the pixels included in the display unit 70 of a display apparatus in a comparison example and the pixels included in the display unit 70 of the display apparatus 10 according to the present embodiment. Here, the display apparatus of the comparison example is a display apparatus with a configuration similar to that of the display apparatus 10 except that the display apparatus does not include the current limiting circuit 40. In addition, the amount of emitted light illustrated in FIGS. 15A and 15B represents an amount of emitted light of the pixels positioned near the upper end of the display unit 70. FIG. 15A illustrates the amount of emitted light of the pixels corresponding to the video signals supplied to the display panel 60 when the all-black display changes to the all-white display in the display apparatus of the comparison example as in the example illustrated in FIG. 12A. In addition, FIG. 15B illustrates the amount of emitted light of the pixels corresponding to the limit signals supplied to the display panel 60 when the all-black display changes to the all-white display in the display apparatus 10 according to the present embodiment as in the example illustrated in FIG. 12B. Time points T10 to T14 illustrated in FIGS. 15A and 15B correspond to time points T10 to T14 illustrated in FIGS. 12A and 12B, respectively.

Figure 16:
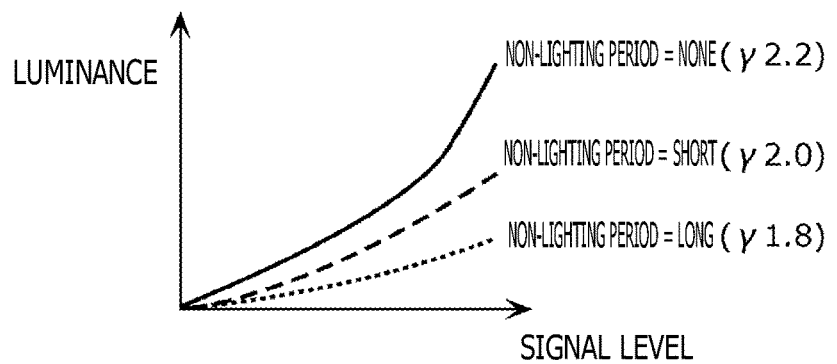
FIG. 16 is a graph illustrating an example of a relation between luminance in the pixels included in the display unit and a signal level according to the embodiment.

FIG. 16 is a graph illustrating an example of the relation between the luminance in the pixels included in the display unit 70 and the signal level according to the present embodiment.

As in FIGS. 12A and 12B, the period from time point T10 to time point T12, the period from time point T12 to time point T13, and the period from time point T13 to time point T14 correspond to vertical periods in FIGS. 15A and 15B. Periods that are immediately after time point T10, time point T12, and time point T13 and in which the amount of emitted light is zero are initialization periods of the pixels, and the signals corresponding to the pixel values are written to the pixels after the initialization periods. As a result, the amount of emitted light of the pixels increases according to the pixel values.

In the graph illustrated in FIG. 15A, large pixel values corresponding to the white display are written in all vertical periods, and the amount of emitted light increases to approximately the same level in all of an Nth frame, an (N+1)th frame, and an (N+2)th frame. In this way, when the amount of emitted light of each pixel increases, the power consumption in the plurality of pixels exceeds the control target power value around time point T11 as illustrated in FIG. 12A. Hence, the lighting control circuit 66 provides a non-lighting period set in the non-lighting state (that is, a period in which the amount of emitted light is zero, excluding the initialization period) around time point T11. This can prevent the power consumption in the plurality of pixels from exceeding the control target power value. The higher the proportion of the pixels in the white display state is, the more frequently the non-lighting period is provided (that is, the longer the non-lighting period is). Therefore, as illustrated in FIG. 15A, the frequency of providing the non-lighting period gradually increases from time point T11 to time point T12.

On the other hand, the display apparatus 10 according to the present embodiment includes the current limiting circuit 40, and the pixel values included in the limit signals input to the display panel 60 are reduced to values lower than the pixel values included in the video signals even when the video signals corresponding to the all-white display are input as in the display apparatus of the comparison example. Specifically, as illustrated in FIG. 12B, although the pixel values similar to those in the display apparatus of the comparison example are written to the pixels near the upper end of the display unit 70 in the Nth frame, pixel values smaller than those in the display apparatus of the comparison example are written in the (N+1)th frame and the (N+2)th frame. Accordingly, as illustrated in FIG. 15B, peak values of the amount of emitted light in the (N+1)th frame and the (N+2)th frame in the display apparatus 10 according to the present embodiment are lower than the peak values of the amount of emitted light in the display apparatus of the comparison example illustrated in FIG. 15A. In this way, the amount of emitted light in the plurality of pixels is small in the display apparatus 10 according to the present embodiment. That is, the power consumption is low in the display apparatus 10 according to the present embodiment. Therefore, as illustrated in the (N+1)th frame of FIG. 15B, there are fewer non-lighting periods than the non-lighting periods in the (N+1)th frame of the display apparatus of the comparison example. Furthermore, as illustrated in FIG. 12B, the current limiting circuit 40 can suppress the power consumption in the plurality of pixels to one equal to or smaller than the control target power value in the (N+2)th frame, and there is no non-lighting period in the (N+2)th frame as illustrated in FIG. 15B.

In addition, as illustrated in FIG. 12B, pixel values smaller than those in the pixels near the upper end are written to the pixels near the lower end of the display unit 70 in the Nth frame. Hence, the power consumption in the plurality of pixels of the display apparatus 10 according to the present embodiment in the Nth frame is lower than the power consumption in the plurality of pixels of the display apparatus of the comparison example. Thus, as illustrated in FIG. 15B, there are fewer non-lighting periods in the Nth frame of the display apparatus 10 according to the present embodiment than the non-lighting periods in the Nth frame of the display apparatus of the comparison example.

When the pixel values written to the pixels are large as illustrated in the Nth frame of FIG. 15B, the slope of the waveform of the amount of emitted light after the initialization period is sharper than that when the pixel values written to the pixels are small as illustrated in the (N+1)th frame and the (N+2)th frame. In this way, the slope of the waveform of the amount of emitted light varies according to the signal level.

On the other hand, the slope of the waveform of the luminance at the end of the non-lighting period is sharp in any signal level.

In this way, although the slope of the waveform of the amount of emitted light in the period in which the signals are written depends on the signal level, the slope of the waveform of the amount of emitted light after the end of the non-lighting period does not depend on the signal level. Hence, as illustrated in FIG. 16, the relation between the luminance corresponding to the amount of emitted light of the pixels and the signal level varies according to the length of the non-lighting period. In the example illustrated in FIG. 16, the luminance is proportional to the signal level to the power of 2.2 when there is no non-lighting period, the luminance is proportional to the signal level to the power of 2.0 when the non-lighting period is relatively short, and the luminance is proportional to the signal level to the power of 1.8 when the non-lighting period is relatively long. In this way, the luminance characteristics (that is, gamma characteristics) of the display unit 70 vary according to the length of the non-lighting period. That is, the image quality of the display apparatus 10 may be reduced due to the fluctuation in the non-lighting period.

Therefore, for example, the non-lighting period may become long in the display apparatus of the comparison example as in the (N+1)th frame and the (N+2)th frame illustrated in FIG. 15A, and the image quality may be reduced.

On the other hand, in the display apparatus 10 according to the present embodiment, the current limiting circuit 40 corrects the pixel values included in the video signals, and the display panel 60 displays a video according to the limit signals in which the pixel values are corrected. As described with reference to FIG. 12B, the current limiting circuit 40 cannot suppress the pixel values to values equal to or smaller than the control target power value only in approximately two vertical periods in which the pixel values suddenly rise, and hence, the lighting control circuit 66 in the display panel 60 controls the pixels in the non-lighting state only in approximately two vertical periods in which the pixel values suddenly rise. Furthermore, the non-lighting period that may be included in each frame is significantly shorter than that in the display apparatus of the comparison example. Therefore, the variation in gamma characteristics, that is, the reduction in image quality, is also suppressed in the display apparatus 10 according to the present embodiment.

In this way, according to the display apparatus 10 of the present embodiment, the power consumption in the display panel can surely be suppressed, while the reduction in the image quality of the display panel is suppressed.

Other Embodiment

Although the display apparatus and the current limiting method according to the present disclosure have been described in reference to the embodiment, the display apparatus and the current limiting method according to the present disclosure are not limited to the embodiment. Other embodiments realized by any constituent elements in the embodiment being combined, modifications obtained by the embodiment being modified in various ways conceived by those skilled in the art without departing from the scope of the present disclosure, and various devices including the processing circuits and other components according to the present embodiment are also included in the present disclosure.

For example, the current limiting circuit 40 and the display panel 60 may be integrated or may be separated in the display apparatus 10. For example, the current limiting circuit 40 and the display panel 60 may be arranged in the same housing or may be arranged in different housings.

In addition, although the pixel included in the display panel includes three subpixels corresponding to three colors of RGB in the configuration illustrated in the embodiment, the configuration of the pixel is not limited to this. For example, the pixel may include four subpixels corresponding to four colors of RGBW. In addition, the pixel may include a single circuit as illustrated in FIG. 5 when the display panel is a monochrome display panel.

In addition, although the video signals include the RGB signals in the embodiment, the video signals may include signals other than the RGB signals. That is, it is only necessary that the video signals include the RGB signals.

In addition, the video signals are not limited to the signals including the RGB signals. For example, the video signals may be color difference signals including luminance signals. In this case, luminance Y included in the color difference signals can be used as a pixel value.

In addition, although the organic EL element is used as the self-luminous element in the example illustrated in the embodiment, the self-luminous element is not limited to this. For example, an inorganic EL element or other elements may be used as the self-luminous element.

INDUSTRIAL APPLICABILITY

The present disclosure is useful for an organic EL flat panel display, and particularly, the present disclosure is optimal for use in a display with large screen in which the power consumption is large.

REFERENCE SIGNS LIST

10: Display apparatus
40: Current limiting circuit
42: Gain computation circuit
43, 61: Weighted average circuit
44, 62: Horizontal period data computation circuit
46, 63: Screen data storage unit
48: Gain determination circuit
50: Gain multiplication circuit
60: Display panel
64: Lighting state storage unit
65: Screen power computation circuit
66: Lighting control circuit
67: Write processing circuit
68: Source driver
69: Writing shift register
71: Lighting shift register
70: Display unit
81, 82: TFT
84: Capacitor
85r: Self-luminous element

The invention claimed is:

1. A display apparatus comprising:
a display panel that includes a plurality of pixels arranged in a matrix, each of the plurality of pixels including a self-luminous element, and that displays a video according to a video signal; and
a current limiting circuit that limits current consumption in the plurality of pixels, wherein
the current limiting circuit includes
  a gain computation circuit that computes a screen power value corresponding to power consumption in the plurality of pixels in reference to a pixel value included in the video signal and that determines a gain in reference to the screen power value, and
  a gain multiplication circuit that multiplies the pixel value by the gain and that outputs a limit signal including the pixel value multiplied by the gain,
the display panel includes
  a display unit including the plurality of pixels, and
  a lighting control circuit that controls a lighting state of the plurality of pixels in reference to a predicted power value corresponding to power predicted to be consumed in the plurality of pixels, the predicted power value being computed according to the limit signal, to reduce a power consumption value in the plurality of pixels to a value equal to or smaller than a control target power value, and
  the gain is 1 when the screen power value is equal to or smaller than the control target power value, and the gain is a value equal to or smaller than a value obtained by dividing the control target power value by the screen power value, when the screen power value exceeds the control target power value.

2. The display apparatus according to claim 1, wherein the gain is a value obtained by dividing the control target power value by the screen power value, when the screen power value exceeds the control target power value.

3. The display apparatus according to claim 1, wherein the display panel further includes a lighting shift register that outputs, to the display unit, a light emission signal for enabling light emission of the plurality of pixels,
the lighting control circuit compares the predicted power value and the control target power value and outputs a lighting control signal corresponding to a comparison result to the lighting shift register in each horizontal period, and
the lighting shift register outputs the light emission signal according to the lighting control signal.

4. The display apparatus according to claim 3, wherein the display panel further includes
  a horizontal period data computation circuit that computes, in each horizontal period, power consumption in each row of the plurality of pixels according to the limit signal,
  a screen data storage unit that stores the power consumption in each row of the plurality of pixels,
  a lighting state storage unit that stores the lighting control signal output from the lighting control circuit, and
  a screen power computation circuit that computes the predicted power value in reference to horizontal period power conversion data corresponding to the power consumption in each row of the plurality of pixels stored in the screen data storage unit and in reference to the lighting control signal stored in the lighting state storage unit.

5. A current limiting method of limiting current consumption in a plurality of pixels included in a display panel that displays a video according to a video signal, each of the plurality of pixels including a self-luminous element, the plurality of pixels being arranged in a matrix, the current limiting method comprising:
  a gain computation step of calculating a screen power value corresponding to power consumption in the plurality of pixels in reference to a pixel value included in the video signal corresponding to each of the plurality of pixels, and determining a gain in reference to the screen power value;
  a gain multiplication step of multiplying the pixel value by the gain and outputting a limit signal including the pixel value multiplied by the gain; and
  a lighting control step of controlling a lighting state of the plurality of pixels in reference to a predicted power value corresponding to power predicted to be consumed in the plurality of pixels, the predicted power value being computed according to the limit signal, to reduce a power consumption value in the plurality of pixels to a value equal to or smaller than a control target power value, wherein
the gain is 1 when the screen power value is equal to or smaller than the control target power value, and
the gain is a value equal to or smaller than a value obtained by dividing the control target power value by the screen power value, when the screen power value exceeds the control target power value.

* * * * *